United States Patent
Lopatin et al.

(10) Patent No.: US 6,936,925 B1
(45) Date of Patent: *Aug. 30, 2005

(54) SEMICONDUCTOR DEVICE HAVING COPPER LINES WITH REDUCED ELECTROMIGRATION USING AN ELECTROPLATED INTERIM COPPER-ZINC ALLOY FILM ON A COPPER SURFACE

(75) Inventors: Sergey Lopatin, Santa Clara, CA (US); Alexander H. Nickel, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 10/626,371

(22) Filed: Jul. 23, 2003

Related U.S. Application Data

(62) Division of application No. 10/083,809, filed on Feb. 26, 2002, now Pat. No. 6,660,633.

(51) Int. Cl.[7] .................. H01L 21/31; H01L 21/469
(52) U.S. Cl. ............... 257/762; 257/751; 257/752; 257/767; 257/775; 438/687
(58) Field of Search ............... 438/687; 257/762, 257/751–752, 767, 775

(56) References Cited

U.S. PATENT DOCUMENTS

| | | | |
|---|---|---|---|
| 6,022,808 A | 2/2000 | Nogami et al. | |
| 6,624,075 B1 * | 9/2003 | Lopatin et al. | 438/687 |
| 6,630,741 B1 * | 10/2003 | Lopatin et al. | 257/762 |
| 6,660,633 B1 * | 12/2003 | Lopatin et al. | 438/687 |
| 6,717,236 B1 * | 4/2004 | Lopatin et al. | 257/586 |
| 6,811,671 B1 * | 11/2004 | Lopatin et al. | 205/157 |

OTHER PUBLICATIONS

Peter Van Zant, "Microchip Fabrication: A Practical Guide to Semiconductor Processing", 3rd Ed., p. 392 and 397 (1997).

A. Krishnamoorthy, D. Duquette and S. Murarka, "Electrochemical Codeposition and Electrical Characterization of a Copper-Zinc Alloy Metallization", in edited by Adricacos, et al., Electrochem Society Symposium Proceedings, vol. 99-9, May 3-6, Seattle, p. 212.

(Continued)

*Primary Examiner*—Lynne A. Gurley
(74) *Attorney, Agent, or Firm*—Farjami & Farjami LLP

(57) ABSTRACT

The present invention relates to the semiconductor device fabrication industry. More particularly a semiconductor device, having an interim reduced-oxygen Cu—Zn alloy thin film (30) electroplated on a blanket Cu surface (20) disposed in a via (6) by electroplating, using an electroplating apparatus, the Cu surface (20) in a unique chemical solution containing salts of Zn and Cu, their complexing agents, a pH adjuster, and surfactants; and annealing the interim electroplated Cu—Zn alloy thin film (30); filling the via (6) with further Cu (26); annealing and planarizing the interconnect structure (35). The reduction of electromigration in copper interconnect lines (35) is achieved by decreasing the drift velocity in the copper line (35)/via (6), thereby decreasing the copper migration rate as well as the void formation rate, by using an interim conformal Cu-rich Cu—Zn alloy thin film (30) electroplated on a Cu surface (20) from a stable chemical solution, and by controlling the Zn-doping thereof, which improves also interconnect reliability and corrosion resistance.

19 Claims, 5 Drawing Sheets

OTHER PUBLICATIONS

J. Cunningham, "Using Electrochemistry to Improve Copper Interconnect", in Semiconductor International, Spring 2000 (May).

L. Chen and T. Ritzdorf, "ECD Seed Layer for Inlaid Copper Metallization" in edited by Andricacos, et al., Electrochem Society Proceedings, vol. 99-9, May 3-6, Seattle, p. 122.

* cited by examiner

SEMICONDUCTOR DEVICE HAVING COPPER LINES WITH REDUCED ELECTROMIGRATION USING AN ELECTROPLATED INTERIM COPPER-ZINC ALLOY FILM ON A COPPER SURFACE

RELATED APPLICATION

This application is a Divisional Application of, and claims priority from, U.S. patent application Ser. No. 10/083,809, entitled "METHOD OF REDUCING ELECTROMIGRATION IN A COPPER LINE BY ELECTROPLATING AN INTERIM COPPER-ZINC ALLOY THIN FILM ON A COPPER SURFACE AND A SEMICONDUCTOR DEVICE THEREBY FORMED," filed Feb. 26, 2002, now U.S. Pat. No. 6,660,633 by the same Applicants.

CROSS-REFERENCE TO RELATED APPLICATION(S)

This application is also related to the following commonly assigned applications, entitled:
(1) "Chemical Solution for Electroplating a Copper-Zinc Alloy Thin Film," concurrently filed (U.S. Ser. No. 10/081,074);
(2) "Method of Electroplating a Copper-Zinc Alloy Thin Film on a Copper Surface Using a Chemical Solution and a Semiconductor Device thereby Formed," concurrently filed (U.S. Ser. No. 10/082,432);
(3) "Method of Controlling Zinc-Doping in a Copper-Zinc Alloy Thin Film Electroplated on a Copper Surface and a Semiconductor Device thereby Formed," concurrently filed (U.S. Ser. No. 10/082,433);
(4) "Method of Reducing Electromigration in a Copper Line by Zinc-Doping of a Copper Surface from an Electroplated Copper-Zinc Alloy Thin Film and a Semiconductor Device thereby Formed," filed on Dec. 7, 2001 (U.S. Ser. No. 10/016,410);
(5) "Method of Reducing Electromigration by Forming an Electroplated Copper-Zinc Interconnect and a Semiconductor Device thereby Formed," concurrently filed (U.S. Ser. No. 10/084,563); and
(6) "Method of Reducing Electromigration by Ordering Zinc-Doping in an Electroplated Copper-Zinc Interconnect and a Semiconductor Device thereby Formed," filed on Dec. 7, 2001 (U.S. Ser. No. 10/016,645).

TECHNICAL FIELD

The present invention relates to semiconductor devices and their methods of fabrication. More particularly, the present invention relates to the processing of copper interconnect material and the resultant device utilizing the same. Even more particularly, the present invention relates to reducing electromigration in copper interconnect lines by doping their surfaces with a barrier material using wet chemical methods.

BACKGROUND ART

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractory metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. The copper (Cu) interconnect material may be deposited by chemical vapor deposition (CVD), plasma-enhanced chemical vapor deposition (PECVD), sputtering, electroless plating, and electrolytic plating.

However, some disadvantages of using Cu as an interconnect material include etching problems, corrosion, and diffusion into silicon.[1] These problems have instigated further research into the formulation of barrier materials for preventing electromigration in both Al and Cu interconnect lines. In response to electromigration concerns relating to the fabrication of semiconductor devices particularly having aluminum-copper alloy interconnect lines, the industry has been investigating the use of various barrier materials such as titanium-tungsten (TiW) and titanium nitride (TiN) layers as well as refractory metals such as titanium (Ti), tungsten (W), tantalum (Ta), molybdenum (Mo), and their silicides.[2] Although the foregoing materials are adequate for Al interconnects and Al—Cu alloy interconnects, they have not been entirely effective with respect to all-Cu interconnects. Further, though CVD and PECVD have been conventionally used for depositing secondary metal(s) on a primary metal interconnect surface, neither technique provides a cost-effective method of forming a copper-zinc alloy on a Cu interconnect surface. Therefore, a need exists for a low cost and high throughput method of reducing electromigration in copper interconnect lines by decreasing the drift velocity in the copper line/via, in order to decrease the copper migration rate as well as the void formation rate, by using an interim conformal Cu-rich copper-zinc (Cu—Zn) alloy thin film electroplated on a copper (Cu) surface from a stable chemical solution, and controlling the Zn-doping thereof, which improves also interconnect reliability and corrosion resistance.
[1] Peter Van Zant, Microchip Fabrication: A Practical Guide to Semiconductor Processing, $3^{rd}$ Ed., p. 397 (1997).
[2] Id., at 392.

DISCLOSURE OF INVENTION

Accordingly, the present invention provides a method of reducing electromigration in copper interconnect lines by decreasing the drift velocity in the copper line/via, thereby decreasing the copper migration rate as well as the void formation rate, by using an interim conformal Cu-rich Cu—Zn alloy thin film electroplated on a copper (Cu) surface from a stable chemical solution, and controlling the Zn-doping thereof, which improves also interconnect reliability and corrosion resistance, and a semiconductor device thereby formed. The present method involves electroplating the Cu surface, such as a blanket Cu seed layer and a partial thickness plated Cu layer, in a unique nontoxic aqueous chemical electroplating solution containing salts of zinc (Zn) and copper (Cu), their complexing agents, a pH adjuster, and surfactants, thereby forming an interim Cu—Zn alloy thin film layer having some degree of oxygen (O) concentration, wherein the Zn-doping is controllable by varying the electroplating conditions; and annealing the interim Cu—Zn alloy thin film formed on the Cu surface in an environment such as vacuum, nitrogen ($N_2$), hydrogen ($H_2$), formine ($N_2H_2$), or mixtures thereof for reducing the O-concentration in the alloy thin film layer, for modifying the grain structure of the Cu—Zn alloy thin film as well as of the underlying Cu surface, and for forming a mixed Cu—Zn/Cu interface; and further electroplating the alloy thin film layer with Cu for completely filling the via, thereby forming the interconnect structure. The present invention further provides a particular electroplating method which controls the parameters of Zn concentration, pH, temperature, and time in order to form a uniform reduced-oxygen Cu—Zn alloy thin film on a cathode-wafer surface such as a Cu surface for reducing electromigration in the device by decreasing the drift velocity therein which decreases the Cu migration rate in addition to decreasing the void formation rate.

More specifically, the present invention provides a method for fabricating a semiconductor device having an interim conformal Cu-rich Cu—Zn alloy thin film formed on a Cu surface by electroplating the Cu surface in the present chemical solution. The method generally comprises the steps of: (1) providing a semiconductor substrate having a Cu surface; (2) providing a chemical solution; (3) electroplating the Cu surface in the chemical solution, thereby forming an interim Cu—Zn alloy thin film on the Cu surface; (4) rinsing the interim Cu—Zn alloy thin film; (5) drying the interim Cu—Zn alloy thin film; (6) annealing the interim Cu—Zn alloy thin film; (7) filling the via with a Cu-fill on the interim Cu—Zn alloy thin film; and (8) completing fabrication of the semiconductor device.

By electroplating this Cu—Zn alloy thin film on the cathode-wafer surface such as a Cu surface using a stable chemical solution in the prescribed concentration ranges and by subsequently annealing the Cu—Zn alloy thin film electroplated on the Cu surface, the present invention improves Cu interconnect reliability, enhances electromigration resistance, improves corrosion resistance, and reduces manufacturing costs. In particular, the present invention chemical solution is advantageous in that it facilitates formation of an acceptable Cu—Zn alloy thin film over a wide range of bath compositions while the subsequent annealing step removes undesirable oxygen impurities from the formed alloy thin film. The desirable Zn concentration in the Cu—Zn alloy thin film, preferably in a range of approximately 0.2 at. % to approximately 9.0 at. % determined by X-Ray Photoelectron Spectroscopy (XPS) or Auger Electron Spectroscopy (AES), is controllable by varying the electroplating conditions and/or the bath composition. By so controlling the Zn-doping, the present method balances high electromigration performance against low resistivity requirements. Additionally, the Cu surface (e.g., seed layer), being formed by a technique such as electroless deposition, ion metal plasma (IMP), self-ionized plasma (SIP), hollow cathode magnetron (HCM), chemical vapor deposition (CVD), and atomic layer deposition (ALD), is enhanced by the Cu—Zn alloy thin film and is prevented from etching by the high pH value (i.e., basic) of the chemical solution from which the alloy thin film is formed.

Further advantages arise from the present invention's superior fill-characteristics. The present Cu—Zn electroplating solution facilitates better filling of a Cu—Zn alloy thin film on an interconnect, especially for feature sizes in a dimensional range of approximately 0.2 $\mu$m to approximately 0.05 $\mu$m, thereby lowering the resistance of the formed Cu—Zn alloy thin film (e.g., in a resistance range of approximately 2.2 $\mu\Omega$·cm to approximately 2.5 $\mu\Omega$·cm for approximately 1 at. % Zn content in a Cu—Zn alloy thin film, as deposited). Further, the filling capability is enhanced by three beneficial characteristics of the present invention: (1) the instant chemical solution does not etch copper or a copper alloy seed layer; (2) the introduction of Zn into the alloy thin film as well as onto the Cu interconnect improves both step coverage and nucleation; and (3) a variety of organic additives, such as polyethylene glycol (PEG), organo-disulfides, and organo-chlorides, are compatible and may be included in the instant chemical solution for further enhancing the fill profile and grain structure. The present Cu—Zn electroplating solution provides a desirably low Zn content in a Cu alloy interconnect (e.g., in a concentration range of approximately 0.2 at. % to approximately 1.0 at. %) which also imparts (1) a de minimis increase in resistance as well as (2) a maximum improvement in electromigration resistance. The present chemical solution can also provide a desirably low Zn content (e.g., in a range of <<approximately 0.1 at. % or <<approximately 0.2 at. %, virtually undetectable by AES) in a Cu film, wherein the Zn content may be engineered by varying the deposition parameters as well as by modifying the bath composition.

BRIEF DESCRIPTION OF THE DRAWING(S)

For a better understanding of the present invention, reference is made to the below- referenced accompanying drawings. Reference numbers refer to the same or equivalent parts of the present invention throughout the several figures of the drawings.

MODES FOR CARRYING OUT THE INVENTION

Figure 1:
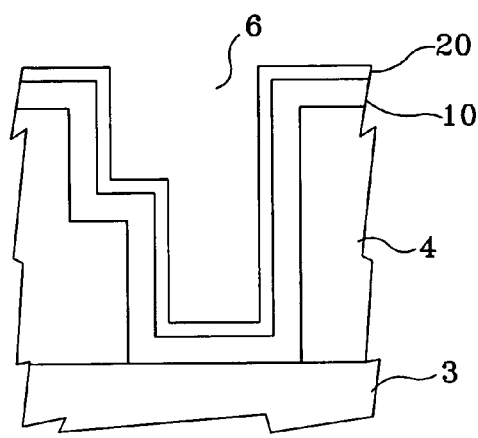
FIG. 1 is a cross-sectional view of a Cu interconnect line formed on a semiconductor substrate and acting as the bottom portion of a via, the via having an optional barrier layer formed therein and a Cu surface, such as a Cu seed layer, formed on the optional barrier layer, in accordance with a first embodiment of the present invention.

FIG. 1 illustrates, by example only, a cross-section of a Cu interconnect line 3, comprising Cu, formed on a semiconductor substrate 4 and acting as the bottom portion of a via 6, the via 6 having a optional barrier layer 10, comprising at least one material selected from a group consisting essentially of titanium silicon nitride ($Ti_xSi_yN_z$), tantalum nitride (TaN), and tungsten nitride ($W_xN_y$), formed therein and a Cu surface 20, such as a blanket Cu seed layer and a partial thickness plated Cu layer, formed on the optional barrier layer 10, in accordance with a first embodiment of the present invention.

Figure 2:
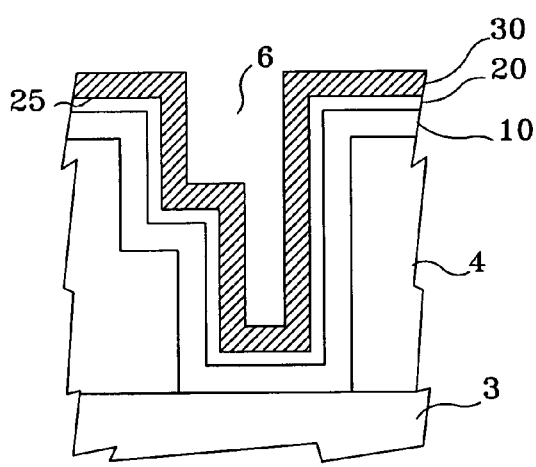
FIG. 2 is a cross-sectional view of the features as shown in FIG. 1, further having an interim conformal Cu—Zn alloy thin film formed and annealed on the Cu surface, in accordance with the first embodiment of the present invention.

FIG. 2 illustrates a cross-section of the Cu interconnect line 3 formed on a semiconductor substrate 4 and acting as the bottom portion of a via 6, the via 6 having the optional barrier layer 10 formed therein and the Cu surface 20 formed on the optional barrier layer 10, as shown in FIG. 1, having an interim conformal Cu—Zn alloy thin film 30 formed and annealed on the Cu surface 20, in accordance with the first embodiment of the present invention.

Figure 3:
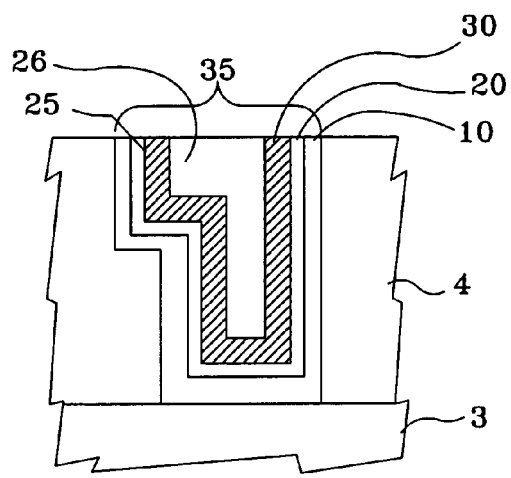
FIG. 3 is a cross-sectional view of the features as shown in FIG. 2, further having been filled with Cu, where the optional barrier layer, the Cu surface, and Cu-fill have been also annealed and subsequently planarized to form a dual-inlaid interconnect structure, in accordance with the first embodiment of the present invention.

FIG. 3 illustrates a cross-section of the Cu interconnect line 3 formed on a semiconductor substrate 4 and acting as the bottom portion of a via 6, the via 6 having a optional barrier layer 10 formed therein and a Cu surface 20 formed on the optional barrier layer 10, having an interim conformal Cu—Zn alloy thin film 30 formed on the Cu surface 20, thereby forming an interface 25, as shown in FIG. 2, having been further filled with Cu to form a Cu- fill 26, the optional barrier layer 10, the Cu surface 20, the interim conformal Cu—Zn alloy thin film 30, and the Cu-fill 26 being also annealed and subsequently planarized by a technique such as chemical mechanical polishing (CMP), thereby forming a dual-inlaid interconnect structure 35, in accordance with the first embodiment of the present invention.

Figure 4:
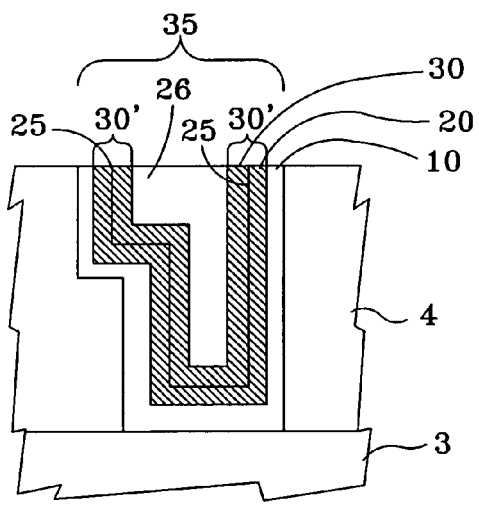
FIG. 4 is a cross-sectional view of the features as shown in FIG. 3, wherein a integral layer comprises the annealed interim conformal Cu—Zn alloy thin film and the annealed Cu surface, in accordance with the first embodiment of the present invention.

FIG. 4 illustrates a cross-section of the Cu interconnect line 3 formed on a semiconductor substrate 4 and acting as the bottom portion of a via 6, the via 6 having a optional barrier layer 10 formed therein and a Cu surface 20 formed on the optional barrier layer 10, having an interim conformal Cu—Zn alloy thin film 30 formed on the Cu surface 20, thereby forming an interface 25, having been further filled with Cu to form a Cu-fill 26, the optional barrier layer 10, the Cu surface 20, the interim conformal Cu—Zn alloy thin film 30, and the Cu- fill 26 being also annealed and subsequently planarized by a technique such as chemical mechanical polishing (CMP), thereby forming a dual-inlaid interconnect structure 35, as shown in FIG. 3, wherein a integral layer 30' comprises the annealed interim conformal Cu—Zn alloy thin film 30 and the annealed Cu surface 20, in accordance with the first embodiment of the present invention.

Figure 5:
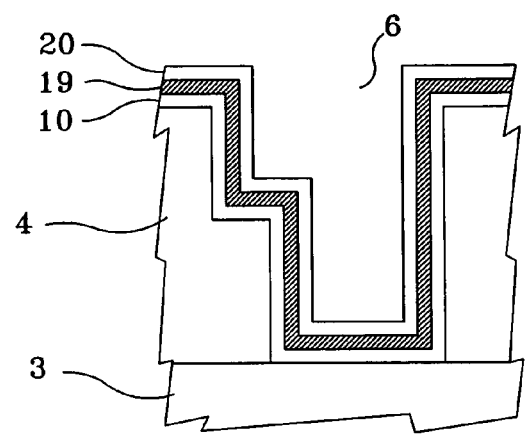
FIG. 5 is a cross-sectional view of a Cu interconnect line formed on a semiconductor substrate and acting as the bottom portion of a via, the via having an optional barrier layer formed therein, an optional underlayer formed on the optional barrier layer, and a Cu surface, such as a Cu seed layer, formed on the optional underlayer, in accordance with a second embodiment of the present invention.

FIG. 5 illustrates, by example only, a cross-section of a Cu interconnect line 3 formed on a semiconductor substrate 4 and acting as the bottom portion of a via 6, the via 6 having an optional barrier layer 10, comprising at least one material selected from a group consisting essentially of titanium silicon nitride ($T_xS_yN_z$), tantalum nitride (TaN), and tungsten nitride ($W_xN_y$) in a thickness range of approximately 10 Å to approximately 30 Å, formed by a technique such as atomic layer deposition (ALD), atomic layer chemical vapor deposition (ALCVD), or chemical vapor deposition (CVD), an optional underlayer 19, comprising at least one material selected from a group consisting essentially of tin (Sn) and palladium (Pd) in a thickness range of approximately 15 Å to approximately 50 Å, formed on the optional barrier layer 10, and a Cu surface 20, comprising electroless Cu in a thickness range of approximately 30 Å to approximately 100 Å, formed on the optional underlayer 19, in accordance with a second embodiment of the present invention.

Figure 6:
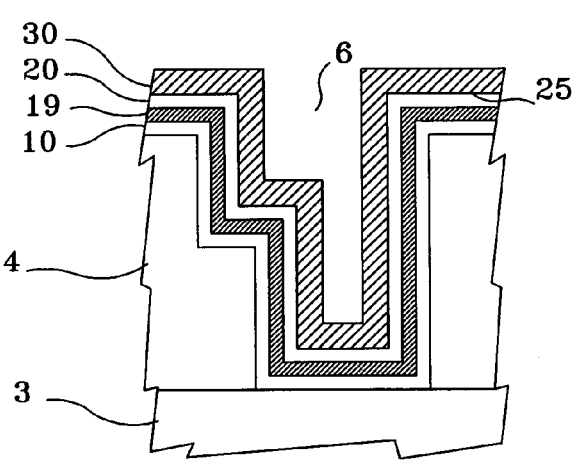
FIG. 6 is a cross-sectional view of the features as shown in FIG. 5, further having an interim conformal Cu—Zn alloy thin film formed and annealed on the Cu surface, in accordance with the second embodiment of the present invention.

FIG. 6 illustrates a cross-section of the Cu interconnect line 3 formed on a semiconductor substrate 4 and acting as the bottom portion of a via 6, the via 6 having an optional barrier layer 10 formed therein, an optional underlayer 19 formed on the optional barrier layer 10, and a Cu surface 20 formed on the optional underlayer 19, a shown in FIG. 5, having an interim conformal Cu—Zn alloy thin film 30, in a thickness range of approximately 100 Å to approximately 300 Å, formed and annealed on the Cu surface 20, thereby forming an interface 25, in accordance with the second embodiment of the present invention.

Figure 7:
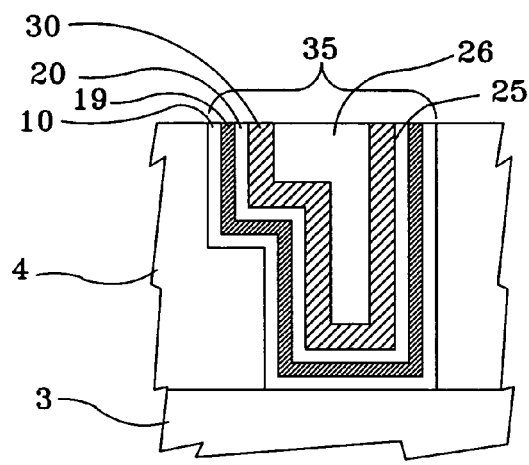
FIG. 7 is a cross-sectional view of the features as shown in FIG. 6, further having been filled with Cu, the barrier layer, the optional underlayer, the Cu surface, the interim conformal Cu—Zn alloy thin film, and the Cu-fill being also annealed and subsequently planarized to form a dual-inlaid interconnect structure, in accordance with the second embodiment of the present invention.

FIG. 7 illustrates a cross-section of the Cu interconnect line 3 formed on a semiconductor substrate 4 and acting as the bottom portion of a via 6, the via 6 having an optional barrier layer 10 formed therein, an optional underlayer 19 formed on the optional barrier layer 10, and the Cu surface 20 formed on the optional underlayer 19, having an interim conformal Cu—Zn alloy thin film 30 formed on the seed layer 20, thereby forming an interface 25, as shown in FIG. 6, and having been further filled with Cu to form a Cu-fill 26, where the optional barrier layer 10, the Cu surface 20, the interim conformal Cu—Zn alloy thin film 30, and the Cu-fill 26 being also annealed and subsequently planarized by a technique such as chemical mechanical polishing (CMP), thereby forming a dual-inlaid interconnect structure 35, in accordance with the second embodiment of the present invention.

Figure 8:
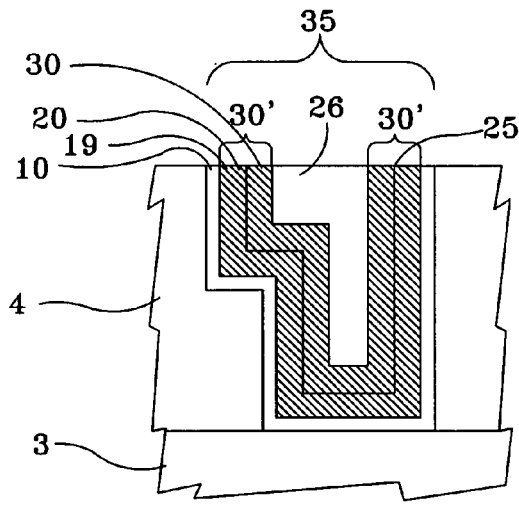
FIG. 8 is a cross-sectional view of the features as shown in FIG. 7, wherein a integral layer comprises the annealed interim conformal Cu—Zn alloy thin film, the annealed Cu surface, and the annealed optional underlayer, in accordance with the second embodiment of the present invention.

FIG. 8 illustrates a cross-section of the Cu interconnect line 3 formed on a semiconductor substrate 4 and acting as the bottom portion of a via 6, the via 6 having a optional barrier layer 10 formed therein and a Cu surface 20 formed on the optional barrier layer 10, having an interim conformal Cu—Zn alloy thin film 30 formed on the Cu surface 20, having been further filled with Cu to form a Cu-fill 26, the optional barrier layer 10, the Cu surface 20, the interim conformal Cu—Zn alloy thin film 30, and the Cu-fill 26 being also annealed and subsequently planarized by a technique such as chemical mechanical polishing (CMP), thereby forming a dual-inlaid interconnect structure 35, as shown in FIG. 7, wherein a integral layer 30' comprises the annealed interim conformal Cu—Zn alloy thin film 30, the annealed Cu surface 20, and the annealed optional underlayer 19, in accordance with the second embodiment the present invention.

Figure 9:
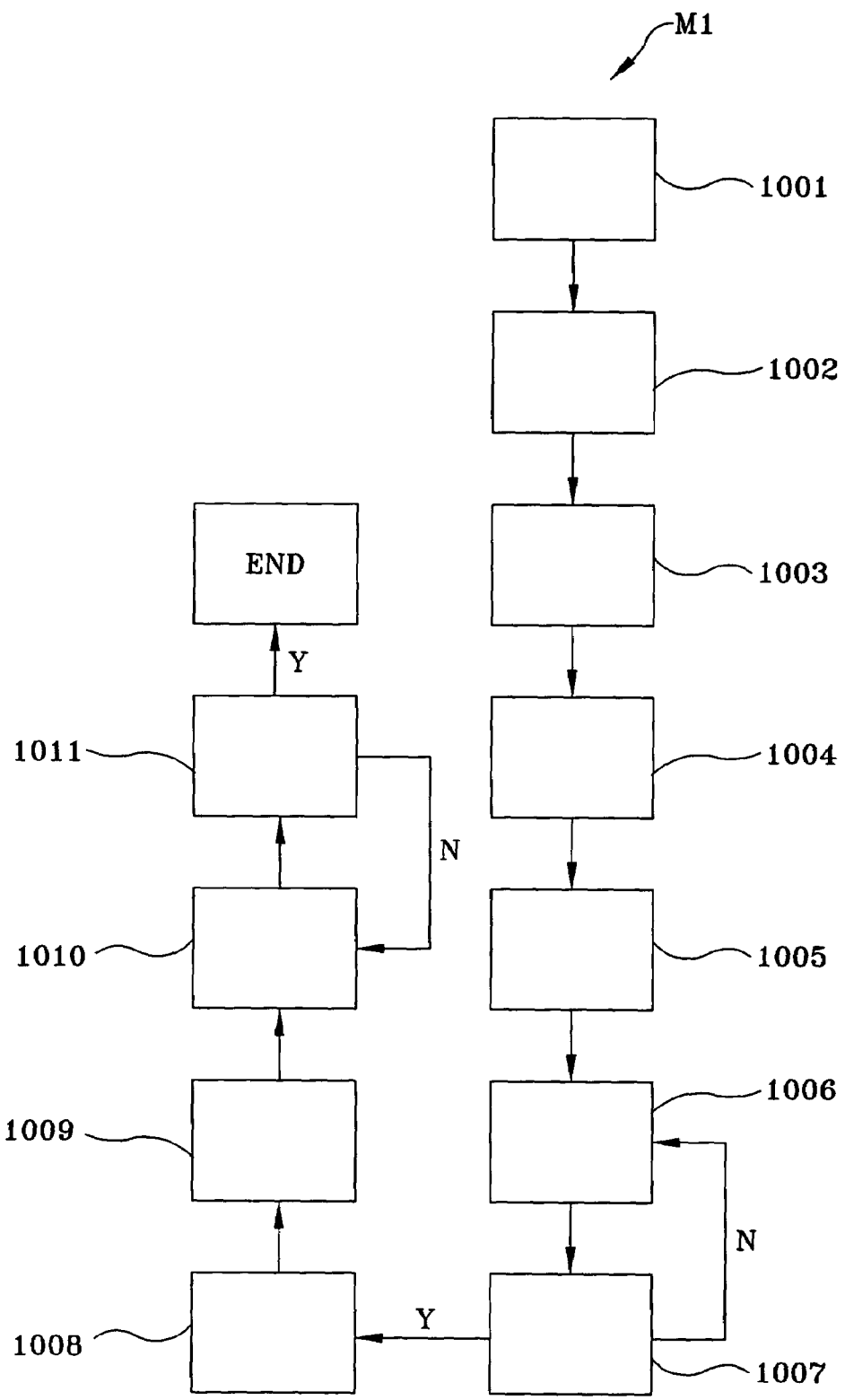
FIG. 9 is a flowchart of a method for synthesizing a unique nontoxic aqueous Cu—Zn electroplating (chemical) solution, in accordance with the present invention.

FIG. 9 flowcharts, by example only, a method M1 for synthesizing a liter of a unique nontoxic aqueous Cu—Zn electroplating (chemical) solution, in accordance with the present invention:

(1) cleaning a mixing vessel (e.g., a beaker) with dilute nitric acid ($HNO_3$) for approximately 5 minutes, as indicated by block 1001;

(2) rinsing the mixing vessel in deionized (DI) water for approximately 5 minutes to approximately 10 minutes and subsequently drying the mixing vessel, for instance, under a gaseous nitrogen ($GN_2$) flow, as indicated by block 1002;

(3) adding an initial volume of DI water (e.g., approximately 400 ml) to the mixing vessel, as indicated by block 1003;

(4) adding at least one Cu ion source for providing a plurality of Cu ions and stirring the at least one Cu ion source into the DI water for a duration in a range of approximately 5 minutes to approximately 10 minutes or until complete dissolution of the at least one Cu ion source in the DI water is achieved, as indicated by block 1004;

(5) adding at least one complexing agent for complexing the plurality of Cu ions and stirring the at least one complexing agent until complete dissolution of the at least one complexing agent in the DI water is achieved, as indicated by block 1005;

(6) adding at least one pH adjuster and stirring the at least one pH adjuster into the DI water for a duration in a range of approximately 5 minutes to approximately 10 minutes or until a clean and transparent solution is achieved, as indicated by block 1006;

(7) measuring the pH of the solution, and, if the pH is within the desired range, proceeding to step (8), otherwise titrating the solution with a small volume of the at least one pH adjuster until the pH falls within the desired range, in essence, returning to step (6), as indicated by block 1007;

(8) adding at least one Zn ion source for providing a plurality of Zn ions and stirring the at least one Zn ion source into the DI water for a duration in a range of approximately 5 minutes to approximately 10 minutes or until complete dissolution of the at least one Zn ion source in the DI water is achieved, as indicated by block 1008;

(9) adding a final volume of DI water (e.g., effecting approximately 1 L in total solution volume) to the mixing vessel, as indicated by block 1009;

(10) optionally adding at least one complexing agent for complexing the plurality of Zn ions and stirring the at least one complexing agent until complete dissolution of the at least one complexing agent in the DI water is achieved, as indicated by block 1010; and

(11) measuring the pH of the solution, and, if the pH is within the desired range, terminating the synthesis, otherwise further titrating the solution with a small volume of the at least one pH adjuster until the pH falls within the desired range, in essence, returning to step (10), as indicated by block 1011.

In addition, the present invention chemical solution may be formulated as follows: wherein the at least one zinc (Zn) ion source comprises at least one zinc salt selected from a group consisting essentially of zinc acetate (($CH_3CO_2)_2Zn$), zinc bromide ($ZnBr_2$), zinc carbonate hydroxide ($ZnCO_3.2Zn(OH)_2$), zinc dichloride ($ZnCl_2$), zinc citrate (($O_2CCH_2C(OH)(CO_2)CH_2CO_2)_2Zn_3$), zinc iodide ($ZnI_2$), zinc L-lactate (($CH_3CH(OH)CO_2)_2Zn$), zinc nitrate ($Zn(NO_3)_2$), zinc stearate (($CH_3(CH_2)_{16}CO_2)_2Zn$), zinc sulfate ($ZnSO_4$), zinc sulfide (ZnS), zinc sulfite ($ZnSO_3$), and their hydrates (preferably zinc chloride or zinc dichloride and zinc citrate), wherein the at least one complexing agent for complexing the plurality of Zn ions comprises tartaric acid ($HO_2CCH(OH)CH(OH)CO_2H$), wherein the tartaric acid prevents precipitation of the plurality of Zn ions from the chemical solution, wherein the at least one copper (Cu) ion source comprises at least one copper salt selected from a group consisting essentially of copper(I) acetate ($CH_3CO_2Cu$), copper(II) acetate (($CH_3CO_2)_2Cu$), copper(I) bromide (CuBr), copper(II) bromide ($CuBr_2$), copper(II) hydroxide ($Cu(OH)_2$), copper(II) hydroxide phosphate ($Cu_2(OH)PO_4$), copper(I) iodide (CuI), copper(II) nitrate hydrate (($CuNO_3)_2$), copper(II) sulfate ($CuSO_4$), copper(I) sulfide ($Cu_2S$), copper(II) sulfide (CuS), copper(II) tartrate ((CH(OH)CO_2)_2Cu$), and their hydrates (preferably copper sulfate), wherein the at least one complexing agent for the plurality of Cu ions comprises at least one species selected from a group consisting essentially of ethylene diamine "EDA" ($H_2NCH_2CH_2NH_2$) and ethylenediaminetetraacetic acid "EDTA" (($HO_2CCH_2)_2NCH_2CH_2N(CH_2CO_2H)_2$), wherein at least one complexing agent prevents precipitation of the plurality of Cu ions from the chemical solution, wherein the at least one pH adjuster comprises at least one pH-adjusting compound selected from a group of pH-adjusting compounds consisting essentially of ammonium hydroxide ($NH_4OH$) and tetramethylammonium hydroxide "TMAH" (($CH_3)_4NOH$), wherein the at least one wetting agent comprises a surfactant, and wherein the surfactant comprises at least one surfactant selected from a group consisting essentially of RE-610™ and polyethylene glycol (PEG).

In the preferred embodiment of the chemical solution, the composition of the method M1 is formulated with component concentration ranges as follows: wherein the at least one zinc (Zn) ion source is provided in a concentration range of approximately 5 g/L to approximately 10 g/L (preferably approximately 10 g/L), wherein the at least one complexing agent for complexing the plurality of Zn ions is provided in a concentration range of approximately 10 g/L to approximately 30 g/L (preferably approximately 20 g/L), wherein the at least one copper (Cu) ion source is provided in a concentration range of approximately 5 g/L to approximately 20 g/L (preferably approximately 10 g/L), wherein the at least one complexing agent for complexing the plurality of Cu ions is provided in a concentration range of approximately 40 g/L to approximately 100 g/L (preferably approximately 80 g/L), wherein the at least one pH adjuster is provided in a concentration range of approximately 10 g/L to approximately 20 g/L (preferably approximately 15 g/L), wherein the at least one wetting agent is provided in a concentration range of approximately 0.01 g/L to approximately 0.1 g/L (preferably approximately 0.02 g/L), wherein the volume of water is provided in a volume range of up to and including approximately 1 L, wherein the solution flow rate is in a range of approximately less than 3 L/min, wherein the solution stir rate is in a range of approximately less than 700 rpm, and wherein the wafer rotation rate is in a range of approximately less than or equal to 700 rpm.

Also, the preferred embodiment involves the following process parameters ranges: wherein the at least one pH adjuster adjusts the chemical solution to a pH range of approximately 7 to approximately 14 (preferably in a pH range of approximately 10 to approximately 12), wherein the chemical solution may be maintained in a temperature range of approximately 16° C. to approximately 35° C. (preferably at a temperature of approximately 24° C.), wherein the Cu surface 20 is electroplated for a duration in a range of approximately 30 seconds to approximately 120 seconds (preferably for a duration of approximately 60 sec), wherein the Cu—Zn alloy thin film 30 is formed having a thickness in a range of approximately 10 nm to approximately 200 nm (preferably having a thickness of approximately 30 nm), and wherein the formed Cu-rich Cu—Zn alloy thin film 30 has a low Zn content of approximately 10 at. % and a high Cu content of approximately 90 at. % (preferably ~1–2 at. % Zn: ~98–99 at. % Cu).

Figure 10:
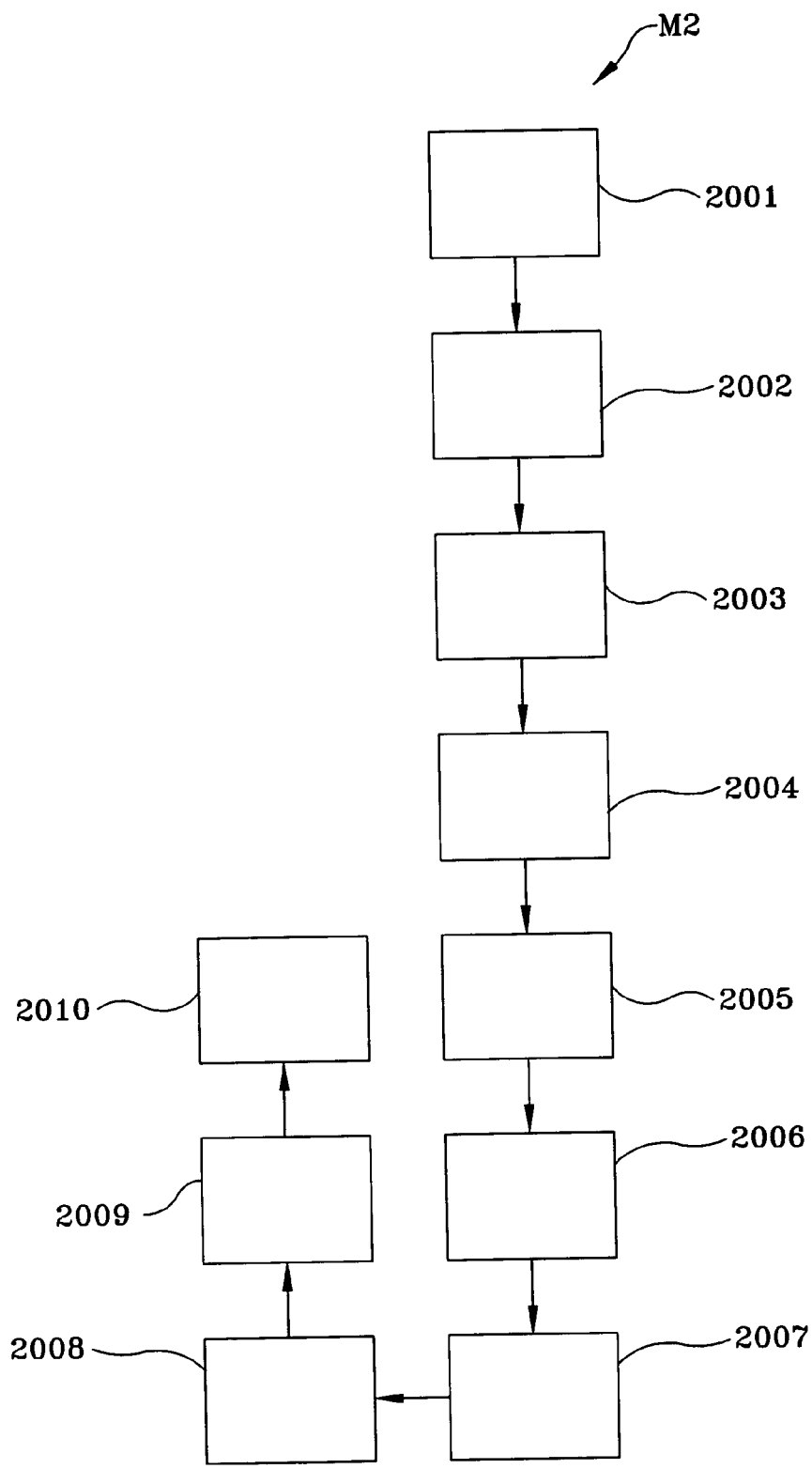
FIG. 10 is a flowchart of a method for forming a Cu—Zn alloy thin film on a Cu surface, in accordance with the present invention.

FIG. 10 flowcharts, by example only, a method M2 for forming a copper-zinc (Cu—Zn) alloy thin film 30 on a copper (Cu) surface 20, having been formed by chemical vapor deposition (CVD), plasma vapor deposition (PVD), plasma-enhanced chemical vapor deposition (PECVD), atomic layer deposition (ALD), or by electroplating the Cu surface 20 in a chemical solution, comprising the steps of: (1) providing a semiconductor substrate having a Cu surface 20 formed on an optional barrier layer 10, and an optional underlayer 19 formed in a via 6 as indicated by block 2001; (2) providing a chemical solution, the chemical solution comprising: at least one zinc (Zn) ion source for providing a plurality of Zn ions; at least one copper (Cu) ion source for providing a plurality of Cu ions; at least one complexing agent for complexing the plurality of Cu ions; at least one pH adjuster; at least one wetting agent for stabilizing the chemical solution, all being dissolved in a volume of water, as shown by block 2002; (3) electroplating the cathode-wafer surface, such as a Cu surface 20, in the chemical solution, thereby forming an interim Cu—Zn alloy thin film 30 on the Cu surface 20, as shown by block 2003; (4) rinsing the interim Cu—Zn alloy thin film 30 formed on the Cu surface 20 in water, as shown by block 2004; (5) drying the interim Cu—Zn alloy thin film 30 formed on the Cu surface 20, for instance, under a gaseous nitrogen flow ($GN_2$), as shown by block 2005; (6) annealing the interim Cu—Zn alloy thin film 30 electroplated on the Cu surface 20 in a temperature range such as 150° C. to 450° C. (preferably in a temperature of approximately 150° C. to approximately 250° C.), wherein the annealing step is performed for a duration range of approximately 0.5 minutes to approximately 60 minutes, thereby reducing the oxygen impurity concentration to a level less than that which is detectable (i.e., ~0.1 at. %) in the alloy thin film 30, thereby modifying the grain structure by increasing the grain size of both the alloy thin film 30 as well as the Cu surface 20, and thereby forming a mixed Cu—Zn interface 25 having a uniform zinc distribution, as indicated by block 2006; (7) filling the via 6 with Cu on the reduced-oxygen Cu—Zn alloy thin film 30, thereby forming a Cu-fill 26, as indicated by block 2007; (8) annealing the Cu-fill 26, the reduced-oxygen Cu—Zn alloy thin film 30, the Cu surface 20, the optional barrier layer 10, and the optional underlayer 19, as indicated by block 2008; (9) planarizing the Cu-fill 26, the reduced-oxygen Cu—Zn alloy thin film 30, the Cu surface 20, the optional barrier layer 10, and the optional underlayer 19, thereby forming a dual-inlaid interconnect structure 35, as indicated by block 2009; and (10) completing fabrication of the semiconductor device, as indicated by block 2010. In the second embodiment of the present invention, the annealing step also facilitates doping of the interim Cu—Zn alloy thin film layer 30 with desirable Sn and Pd impurities from the optional underlayer 19 which structurally stabilizes the alloy thin film 30 by internally increasing its bond strengths. The chemical solution may further comprise at least one complexing agent for complexing the plurality of Zn ions also being dissolved in the volume of DI water.

Figure 11:
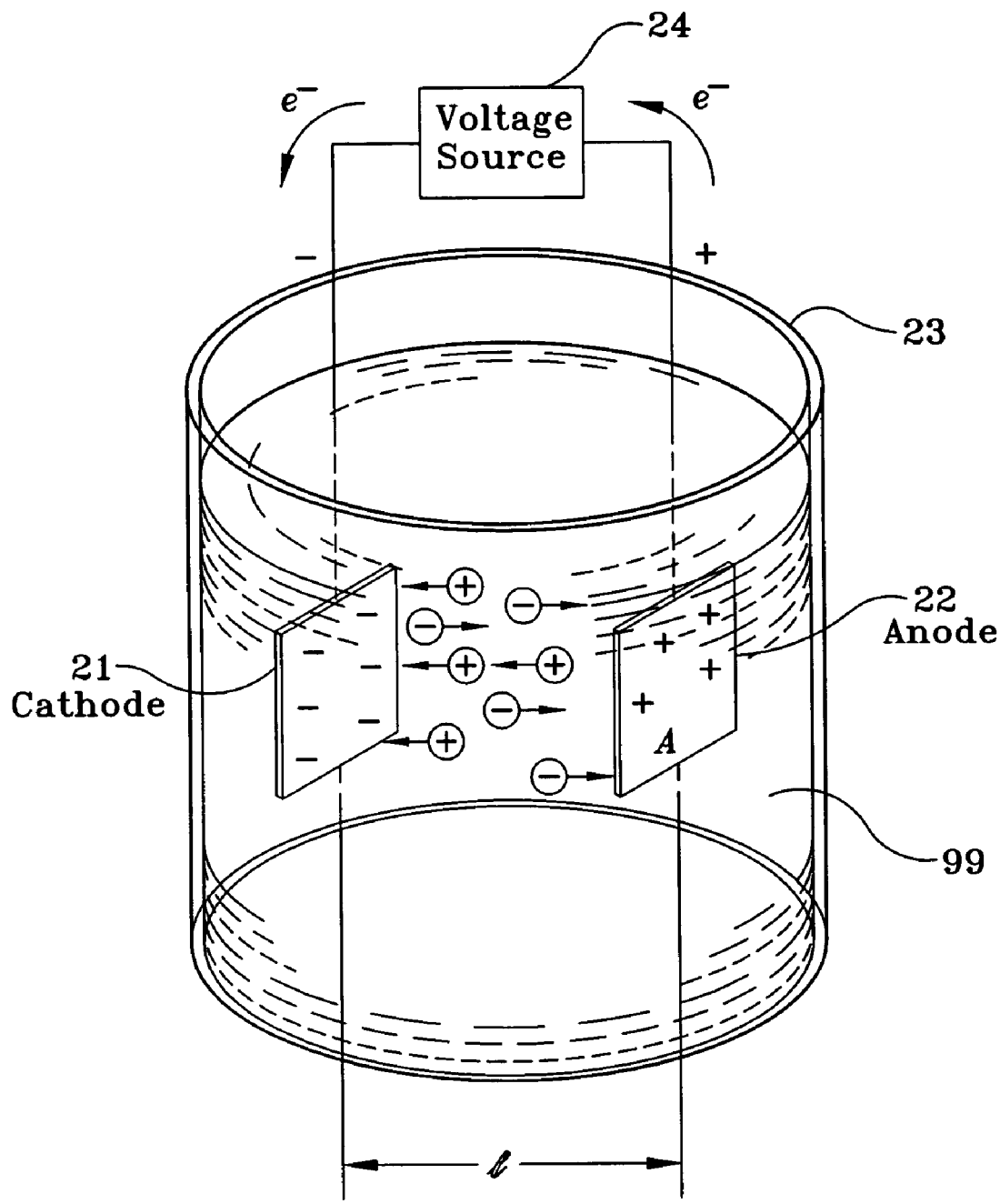
FIG. 11 is a perspective view of an electroplating apparatus using the unique nontoxic aqueous Cu—Zn chemical solution, in accordance with the present invention.

FIG. 11 illustrates, in perspective view, an electroplating apparatus using the unique nontoxic aqueous Cu—Zn chemical solution, in accordance with the present invention. In particular, the electroplating step (3) of FIG. 3 may be performed in this electroplating apparatus comprising: (a) a cathode-wafer 21; (b) an anode 22; (c) an electroplating vessel 23 such as a beaker; and (d) a voltage source 24. The cathode-wafer 21 may comprise a Cu surface 20. The anode 22 may comprise at least one material selected from a group consisting essentially of copper (Cu), a copper-platinum alloy (Cu—Pt), titanium (Ti), platinum (Pt), a titanium-platinum alloy (Ti—Pt), anodized copper-zinc alloy (Cu—Zn, i.e., brass), and platinized titanium (Pt/Ti), and platinized copper-zinc (Pt/Cu—Zn, i.e., platinized brass). The brass alloy may be anodized to form a thin oxide film in situ using the chemical solution 99 prior to electroplating the cathode-wafer 21. The anodized brass anode also provides the following benefits: (1) a uniform current density distribution on the cathode-wafer; (2) a uniform Cu—Zn alloy thin film formation, (3) a uniform Zn distribution across the Cu—Zn alloy thin film surface, and (4) a uniform Zn distribution across the Cu—Zn alloy thin film thickness. The present invention electroplating method also comprises direct voltage in the range of approximately 1 V to approximately 4 V (preferably in a voltage range of approximately 1 V to approximately 2 V); and a direct current in the range of approximately 0.01 A to approximately 0.2 A (preferably in a current range of approximately 0.1 A to approximately 0.15 A). Differential pulse conditions selected from a group consisting essentially of forward pulses, reverse pulses, combinations of forward and reverse pulses, combinations of direct current, and combinations of direct voltage may also be applied.

Further, the Zn-doping in the resultant Cu—Zn alloy thin film 30 may be controlled in the present invention by varying electroplating conditions. For example, increasing the at least one zinc (Zn) ion source concentration slowly increases Zn-doping, increasing the at least one copper (Cu) ion source concentration slowly decreases Zn-doping, increasing the solution flow rate increases Zn-doping, increasing the pH decreases cathodic efficiency with respect to Zn and thereby decreases Zn-doping, increasing the electroplating duration slowly decreases Zn- doping, using a Cu anode decreases Zn-doping, using a brass anode increases Zn-doping, increasing the voltage increases the Zn-doping, and increasing the current increases the Zn-doping.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

INDUSTRIAL APPLICABILITY

The present invention relates to the semiconductor device fabrication industry. More particularly, the present invention relates to reducing electromigration in copper interconnect lines by doping their surfaces with a barrier material using wet chemical methods. Specifically, the present invention provides a method for fabricating a semiconductor device having an interim conformal Cu-rich Cu—Zn alloy thin film formed on a Cu surface by electroplating the Cu surface in the present chemical solution. The method generally comprises the steps of: (1) providing a semiconductor substrate having a Cu surface; (2) providing a chemical solution; (3) electroplating the Cu surface in the chemical solution, thereby forming an interim Cu—Zn alloy thin film on the Cu surface; (4) rinsing the interim Cu—Zn alloy thin film; (5) drying the interim Cu—Zn alloy thin film; (6) annealing the interim Cu—Zn alloy thin film; (7) filling the via with a Cu-fill on the interim Cu—Zn alloy thin film; and (8) completing fabrication of the semiconductor device.

What is claimed:

1. A semiconductor device, having an interim reduced-oxygen copper-zinc (Cu—Zn) alloy thin film formed on a copper (Cu) surface by electroplating the Cu surface in a chemical solution, fabricated by a method comprising the steps of:
   providing a semiconductor substrate having a Cu surface formed in a via;
   providing a chemical solution;
   electroplating the Cu surface in the chemical solution, thereby forming an interim Cu—Zn alloy thin film on the Cu surface;
   rinsing the interim Cu—Zn alloy thin film in a solvent;
   drying the interim Cu—Zn alloy thin film under a gaseous flow;
   annealing the interim Cu—Zn alloy thin film formed on the Cu surface, thereby forming an interim reduced-oxygen Cu—Zn alloy thin film;
   filling the via with Cu on the interim reduced-oxygen Cu—Zn alloy thin film, thereby forming a Cu-fill;
   annealing the Cu-fill, the interim reduced-oxygen Cu—Zn alloy thin film and the Cu surface;
   planarizing the Cu-fill, the interim reduced-oxygen Cu—Zn alloy thin film and the Cu surface, thereby forming a dual-inlaid interconnect structure; and
   completing formation of the semiconductor device.

2. A device, as recited in claim 1,
   wherein the chemical solution is nontoxic and aqueous, and
   wherein the chemical solution comprises:
      at least one zinc (Zn) ion source for providing a plurality of Zn ions;
      at least one copper (Cu) ion source for providing a plurality of Cu ions;
      at least one complexing agent for complexing the plurality of Cu ions;
      at least one pH adjuster;
      at least one wetting agent for stabilizing the chemical solution, all being dissolved in a volume of deionized (DI) water.

3. A device, as recited in claim 2,
   wherein the at least one zinc (Zn) ion source comprises at least one zinc salt selected from a group consisting essentially of zinc acetate ($(CH_3CO_2)_2Zn$), zinc bromide ($ZnBr_2$), zinc carbonate hydroxide ($ZnCO_3.2Zn(OH)_2$), zinc dichloride ($ZnCl_2$), zinc citrate ($(O_2CCH_2C(OH)(CO_2)CH_2CO_2)_2Zn_3$), zinc iodide ($ZnI_2$), zinc L-lactate ($(CH_3CH(OH)CO_2)_2Zn$), zinc nitrate ($Zn(NO_3)_2$), zinc stearate ($(CH_3(CH_2)_{16}CO_2)_2Zn$), zinc sulfate ($ZnSO_4$), zinc sulfide ($ZnS$), zinc sulfite ($ZnSO_3$), and their hydrates.

4. A device, as recited in claim 2,
   wherein the at least one copper (Cu) ion source comprises at least one copper salt selected from a group consisting essentially of copper(I) acetate ($CH_3CO_2Cu$), copper (II) acetate ($(CH_3CO_2)_2Cu$), copper(I) bromide (CuBr), copper(II) bromide ($CuBr_2$), copper(II) hydroxide ($Cu(OH)_2$), copper(II) hydroxide phosphate ($Cu_2(OH)PO_4$), copper(I) iodide (CuI), copper(II) nitrate hydrate ($(CuNO_3)_2$), copper(II) sulfate ($CuSO_4$), copper(I) sulfide ($Cu_2S$), copper(II) sulfide (CuS), copper(II) tartrate ($(CH(OH)CO_2)_2Cu$), and their hydrates.

5. A device, as recited in claim 1,
   wherein said electroplating step comprises using an electroplating apparatus, and
   wherein said electroplating apparatus comprises:
      (a) a cathode-wafer;
      (b) an anode;
      (c) an electroplating vessel; and
      (d) a voltage source.

6. A device, as recited in claim 5,
   wherein the cathode-wafer comprises the Cu surface, and
   wherein the anode comprises at least one material selected from a group consisting essentially of copper (Cu), a copper-platinum alloy (Cu—Pt), titanium (Ti), platinum (Pt), a titanium-platinum alloy (Ti—Pt), anodized copper-zinc alloy (Cu—Zn, i.e., brass), and platinized titanium (Pt/Ti), and platinized copper-zinc (Pt/Cu—Zn, i.e., platinized brass).

7. A device, as recited in claim 1,
   wherein said semiconductor substrate further comprises a barrier layer formed in the via under said Cu surface, and
   wherein the barrier layer comprises at least one material selected from a group consisting essentially of titanium silicon nitride ($T_xS_yN_z$), tantalum nitride (TaN), and tungsten nitride ($W_xN_y$).

8. A device, as recited in claim 7,
   wherein said semiconductor substrate further comprises an underlayer formed on the barrier layer,
   wherein said underlayer comprises at least one material selected from a group consisting essentially of tin (Sn) and palladium (Pd), and
   wherein said Cu surface is formed over said barrier layer and on said underlayer.

9. A device, as recited in claim 8,
   wherein said underlayer comprises a thickness range of approximately 15 Å to approximately 50 Å,
   wherein said barrier layer comprises a thickness range of approximately 10 Å to approximately 30 Å,
   wherein said Cu surface comprises a thickness range of approximately 30 Å to approximately 100 Å, and
   wherein said interim Cu—Zn alloy thin film comprises a thickness range of approximately 100 Å to approximately 300 Å.

10. A semiconductor device comprising:
a semiconductor substrate having a via;
a Cu surface residing in said via;
an interim reduced-oxygen Cu—Zn alloy thin film residing on said Cu surface;
said interim reduced-oxygen Cu—Zn alloy thin film having a uniform Zn doping distribution across the Cu surface;
a Cu-fill residing on the interim Cu—Zn reduced-oxygen alloy thin film;
said Cu-fill, the interim reduced-oxygen Cu—Zn alloy thin film and the Cu surface being annealed; and
said Cu-fill, the interim reduced-oxygen Cu—Zn alloy thin film and the Cu surface being planarized.

11. A device, as recited in claim 10,
wherein the interim reduced-oxygen Cu—Zn alloy thin film is formed by electroplating in a nontoxic and aqueous chemical solution, and
wherein the chemical solution comprises:
   at least one zinc (Zn) ion source for providing a plurality of Zn ions;
   at least one copper (Cu) ion source for providing a plurality of Cu ions;
   at least one complexing agent for complexing the plurality of Cu ions;
   at least one pH adjuster;
   at least one wetting agent for stabilizing the chemical solution, all being dissolved in a volume of deionized (DI) water.

12. A device, as recited in claim 11,
wherein the at least one zinc (Zn) ion source comprises at least one zinc salt selected from a group consisting essentially of zinc acetate (($CH_3CO_2)_2Zn$), zinc bromide ($ZnBr_2$), zinc carbonate hydroxide ($ZnCO_3.2Zn(OH)_2$), zinc dichloride ($ZnCl_2$), zinc citrate (($O_2CCH_2C(OH)(CO_2)CH_2CO_2)_2Zn_3$), zinc iodide ($ZnI_2$), zinc L- lactate (($CH_3CH(OH)CO_2)_2Zn$), zinc nitrate ($Zn(NO_3)_2$), zinc stearate ($CH_3(CH_2)_{16}CO_2)_2Zn$), zinc sulfate ($ZnSO_4$), zinc sulfide (ZnS), zinc sulfite ($ZnSO_3$), and their hydrates.

13. A device, as recited in claim 11,
wherein the at least one copper (Cu) ion source comprises at least one copper salt selected from a group consisting essentially of copper(I) acetate ($CH_3CO_2Cu$), copper (II) acetate (($CH_3CO_2)_2Cu$), copper(I) bromide (CuBr), copper(II) 5 bromide ($CuBr_2$), copper(II) hydroxide ($Cu(OH)_2$), copper(II) hydroxide phosphate ($Cu_2(OH)PO_4$), copper(I) iodide (CuI), copper(II) nitrate hydrate (($CuNO_3)_2$), copper(II) sulfate ($CuSO_4$), copper(I) sulfide ($Cu_2S$), copper(II) sulfide (CuS), copper(II) tartrate (($CH(OH)CO_2)_2Cu$), and their hydrates.

14. A device, as recited in claim 11,
wherein said electroplating comprises using an electroplating apparatus, and
wherein said electroplating apparatus comprises:
   (a) a cathode-wafer;
   (b) an anode;
   (c) an electroplating vessel; and
   (d) a voltage source.

15. A device, as recited in claim 14,
wherein the cathode-wafer comprises the Cu surface, and
wherein the anode comprises at least one material selected from a group consisting essentially of copper (Cu), a copper-platinum alloy (Cu—Pt), titanium (Ti), platinum (Pt), a titanium-platinum alloy (Ti—Pt), anodized copper-zinc alloy (Cu—Zn, i.e., brass), and platinized titanium (Pt/Ti), and platinized copper-zinc (Pt/Cu—Zn, i.e., platinized brass).

16. A device, as recited in claim 10,
wherein said semiconductor substrate further comprises a barrier layer formed in the via under said Cu surface, and
wherein the barrier layer comprises at least one material selected from a group consisting essentially of titanium silicon nitride ($Ti_xSi_yN_z$), tantalum nitride (TaN), and tungsten nitride ($W_xN_y$).

17. A device, as recited in claim 16,
wherein said semiconductor substrate further comprises an underlayer formed on the barrier layer,
wherein said underlayer comprises at least one material selected from a group consisting essentially of tin (Sn) and palladium (Pd),
wherein said Cu surface is formed over said barrier layer and on said underlayer, and
wherein said Cu surface is electroless Cu.

18. A device, as recited in claim 17,
wherein said underlayer comprises a thickness range of approximately 15 Å to approximately 50 Å,
wherein said barrier layer comprises a thickness range of approximately 10 Å to approximately 30 Å,
wherein said Cu surface comprises a thickness range of approximately 30 Å to approximately 100 Å, and
wherein said interim Cu—Zn alloy thin film comprises a thickness range of approximately 100 Å to approximately 300 Å.

19. A semiconductor device comprising:
a semiconductor substrate having a via; and
a dual-inlaid interconnect structure formed and disposed in said via, said interconnect structure comprising:
   at least one annealed, conformal Cu surface formed in said via;
   at least one annealed, electroplated, conformal interim reduced-oxygen Cu—Zn alloy thin film having a uniform Zn distribution disposed on the at least one Cu surface; and
at least one annealed, conformal Cu-fill disposed on said at least one annealed, electroplated, conformal interim reduced-oxygen Cu—Zn alloy thin film.

* * * * *